US008816777B2

(12) United States Patent
Szilagyi

(10) Patent No.: US 8,816,777 B2
(45) Date of Patent: Aug. 26, 2014

(54) MICROWAVE SYNTHESIZER

(75) Inventor: Tomany Szilagyi, Coarsegold, CA (US)

(73) Assignee: Tomany Szilagyi, Notincs (HU)

( * ) Notice: Subject to any disclaimer, the term of this patent is extended or adjusted under 35 U.S.C. 154(b) by 0 days.

(21) Appl. No.: 13/236,841

(22) Filed: Sep. 20, 2011

(65) Prior Publication Data

US 2013/0069699 A1 Mar. 21, 2013

(51) Int. Cl.
*H03L 7/087* (2006.01)
*H03L 7/22* (2006.01)
*H03B 21/00* (2006.01)
*H03L 7/08* (2006.01)

(52) U.S. Cl.
CPC .................................... *H03L 7/08* (2013.01)
USPC ........ 331/2; 331/11; 331/18; 331/40; 331/47; 327/156; 375/376

(58) Field of Classification Search
USPC ........ 327/147, 156; 331/2, 11, 16–18, 37, 40, 331/41, 46–48; 375/373, 376
See application file for complete search history.

(56) References Cited

U.S. PATENT DOCUMENTS

| | | | | | |
|---|---|---|---|---|---|
| 4,114,110 | A | * | 9/1978 | Nossen | 331/2 |
| 4,388,597 | A | * | 6/1983 | Bickley et al. | 331/2 |
| 4,514,705 | A | * | 4/1985 | Harzer | 331/2 |
| 4,800,341 | A | * | 1/1989 | Johnson | 331/2 |
| 4,940,950 | A | * | 7/1990 | Helfrick | 331/2 |
| 4,963,838 | A | * | 10/1990 | Hareyama | 331/2 |
| 5,053,722 | A | * | 10/1991 | Kuo et al. | 331/2 |
| 5,717,730 | A | * | 2/1998 | Prakash et al. | 375/376 |
| 5,856,766 | A | * | 1/1999 | Gillig et al. | 331/176 |
| 7,324,788 | B2 | * | 1/2008 | Ramet et al. | 455/76 |
| 2008/0063129 | A1 | * | 3/2008 | Voutilainen | 375/376 |

* cited by examiner

*Primary Examiner* — Levi Gannon

(57) ABSTRACT

A microwave synthesizer is disclosed that may generate low phase noise and high frequency resolution microwave signals The microwave synthesizer may include a coarse-tuning loop, the coarse-tuning loop may be adopted to generate a first signal with coarsely adjustable frequency. The coarse-tuning loop may have a first voltage controlled oscillator (VCO). An output loop, the output loop may be adopted to generate a second signal with finely adjustable frequency. The output loop may have a second VCO. A frequency mixer may be configured to couple the coarse-tuning loop and the output loop. A frequency mixer may be adopted to subtract the first and second signals. A reference frequency source may be coupled to the coarse-tuning loop and the output loop to provide reference signal for the microwave synthesizer.

1 Claim, 3 Drawing Sheets

B2

MICROWAVE SYNTHESIZER

FIELD OF THE INVENTION

The present invention relates generally to microwave synthesizers. More particularly, the present invention relates to a low phase noise and high-resolution microwave synthesizer with two identical voltage controlled oscillators.

BACKGROUND OF THE INVENTION

Improvements of high-frequency electronic devices for consumer products such as cellular telephones, pagers, and wireless personal data assistants (PDAs), have given rise to a need for improved electronic testing. At the same time, pressures are applied to product manufacturers to reduce testing costs.

An important component in the testing of high-frequency electronic devices is the microwave synthesizer. Synthesizers are electronic instruments that generate test signals of variable frequency. The test signals are generally single frequency "tones" having low noise. Modern synthesizers include programmable electronics that afford them high frequency resolution over a wide range of frequencies. "Microwave "synthesizers" are synthesizers that produce output signals in the microwave frequency band, i.e., near 1 GHz or higher.

A common type of test for high frequency devices involves measuring the electronic noise that the device produces. To perform this type of test, the device under testing (DUT) is connected to a test system, or "tester." The tester generally includes a microwave synthesizer. Noise on the output signal is then measured and the measured noise is compared with test limits to determine whether the DUT's noise performance is within the test limits.

For many high-frequency devices, the output signals from the DUT are generally a function of the input signals applied to the DUT. For example, if the input signal has a frequency $f_{in}$, the output generally also has the frequency $f_{in}$, or a multiple thereof. The exact input-output relationship depends upon the type of device being tested, but some numerical relationship between input and output is usually present. This being the case, any noise produced by the synthesizer may appear at the output signal. This noise creates an uncertainty in any noise measurement of the DUT, since it is not clear whether the noise measured is produced by the DUT or injected by the synthesizer.

Therefore, the noise of the synthesizer is one of most important aspect of its specification. By reducing this noise, measurement uncertainties are correspondingly reduced and the quality of testing is improved.

SUMMARY OF THE INVENTION

In one aspect, the present invention provides a microwave synthesizer. The microwave synthesizer includes a coarse-tuning loop, the coarse-tuning loop adopted to generate a first signal with coarsely adjustable frequency. The course-tuning loop has a first voltage controlled oscillator (VCO). An output loop, the output loop adopted to generate a second signal with finely adjustable frequency. The output loop has a second VCO. A frequency mixer configured to couple the coarse-tuning loop and the output loop. The frequency mixer adopted to sum the first and second signals. A reference frequency source coupled to the coarse-tuning loop and the output loop to provide reference signal for the microwave synthesizer.

BRIEF DESCRIPTION OF THE DRAWINGS

The following Detailed Description proceeds with reference to the accompanying Drawings, in which.

DETAILED DESCRIPTION

Figure 1:
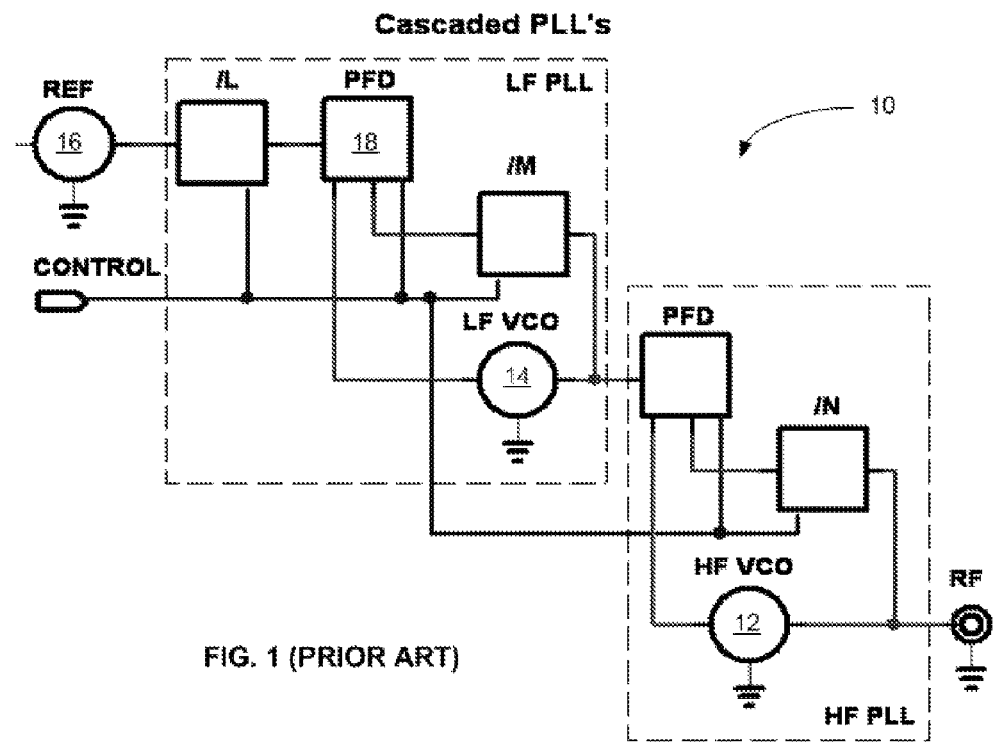
FIG. 1 is a block diagram of a conventional Cascaded Phase Locked Loops Synthesizer according to prior art.

The present invention is now described in more detail. While it is disclosed in its preferred form, the specific embodiments of the invention as disclosed herein and illustrated in the drawings are not to be considered in a limiting sense. Rather, these embodiments are provided so that this disclosure will be thorough and complete, and will fully convey the scope of the invention to those skilled in the art. Indeed, it should be readily apparent in view of the present description that the invention might be modified in numerous ways. Among other things, the present invention may be embodied as devices, methods, and so on. Accordingly, the present invention may take the form of an entirely device embodiment, an entirely method embodiment, or an embodiment combining aspects of the above. This description is therefore, not to be taken in a limiting sense.

Figure 2:
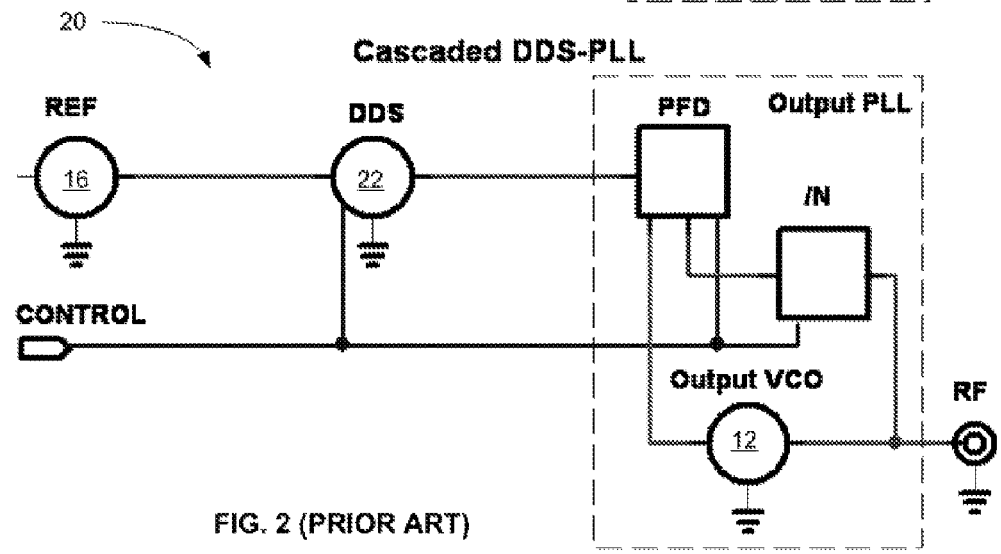
FIG. 2 is a block diagram of a conventional Cascaded Direct Digital Synthesizer-Phase Locked Loops Synthesizer according to prior art.

Referring now to FIGS. 1-2, block diagrams of different implementations of microwave synthesizers 10 and 20 using cascaded phase locked loops are shown according to prior art. A high frequency microwave voltage controlled oscillator (VCO) 12 is phase locked to a lower frequency VCO 14, which is in turn locked to a fixed frequency reference 16. Alternatively, the low frequency phase-frequency detector (PFD) 18 can be substituted by a direct digital synthesizer (DDS). The lower frequency PFD 18 takes fine steps, while the microwave VCO 12 takes steps that are N times the output frequency of the lower frequency PFD 18. The in-loop phase noise of the microwave PFD is between $20 \times \log_{10}(N)$ and $10 \times \log_{10}(N)$ dB degraded from the phase noise of the lower frequency PFD 18 or DDS 22. The smaller the frequency increment implemented, the higher the inner-loop phase noise may be.

Figure 3:
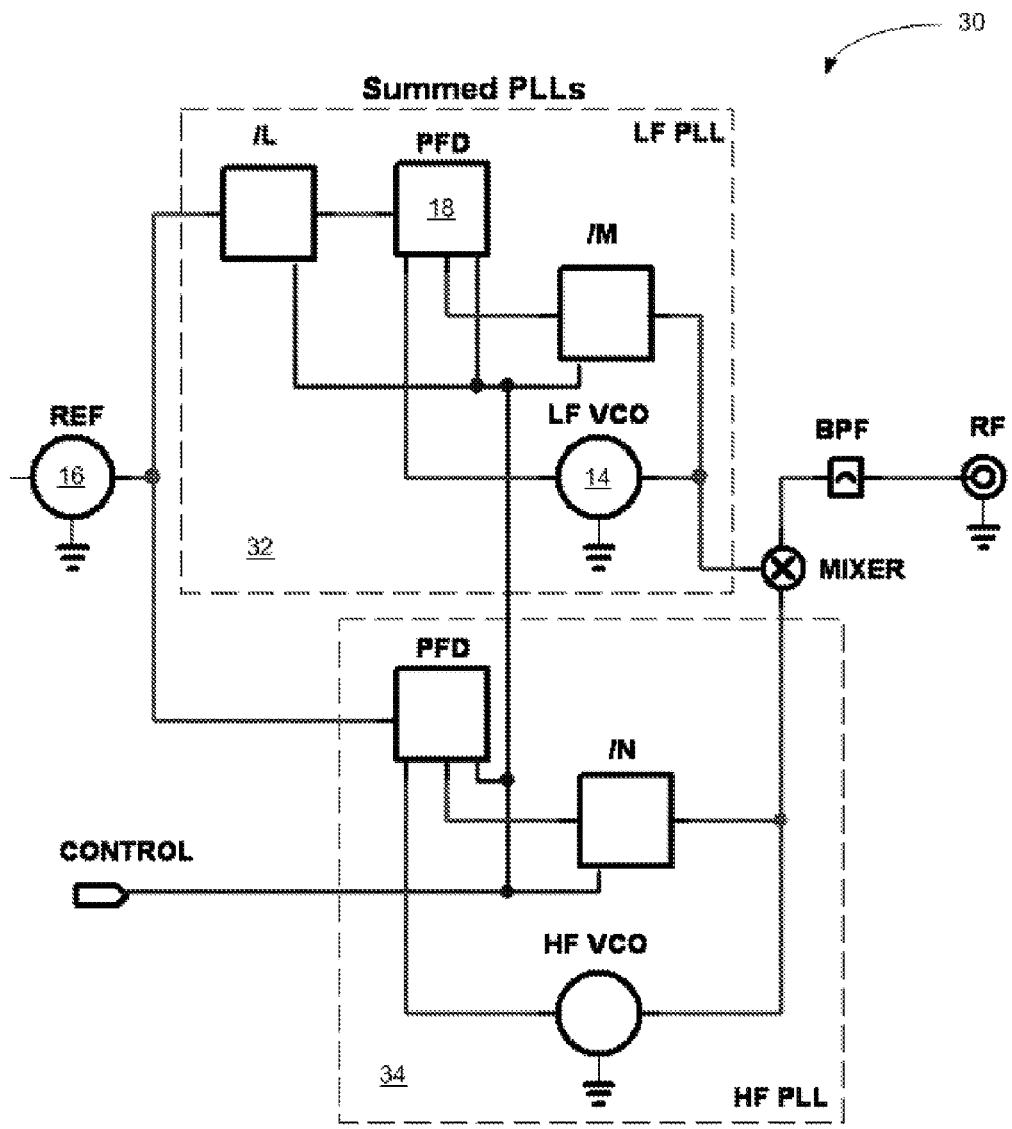
FIG. 3 is a block diagram of a conventional Multiple Summed Phase Locked Loops Synthesizer according to prior art.

Referring now to FIG. 3, a block diagram of microwave synthesizer 30 using summed PPLs is shown according to prior art. Frequencies of loops 32 and 34 may be summed at their output. Resulting a final output frequency to be either a sum or the frequencies $f_{HFPLL}$ and $f_{LFPLL}$, or a difference of the frequencies $f_{HFPLL}$ and $f_{LFPLL}$. Phase noise degradation of the microwave synthesizer 30 is minimal, however its output frequency range is limited.

Figure 4:
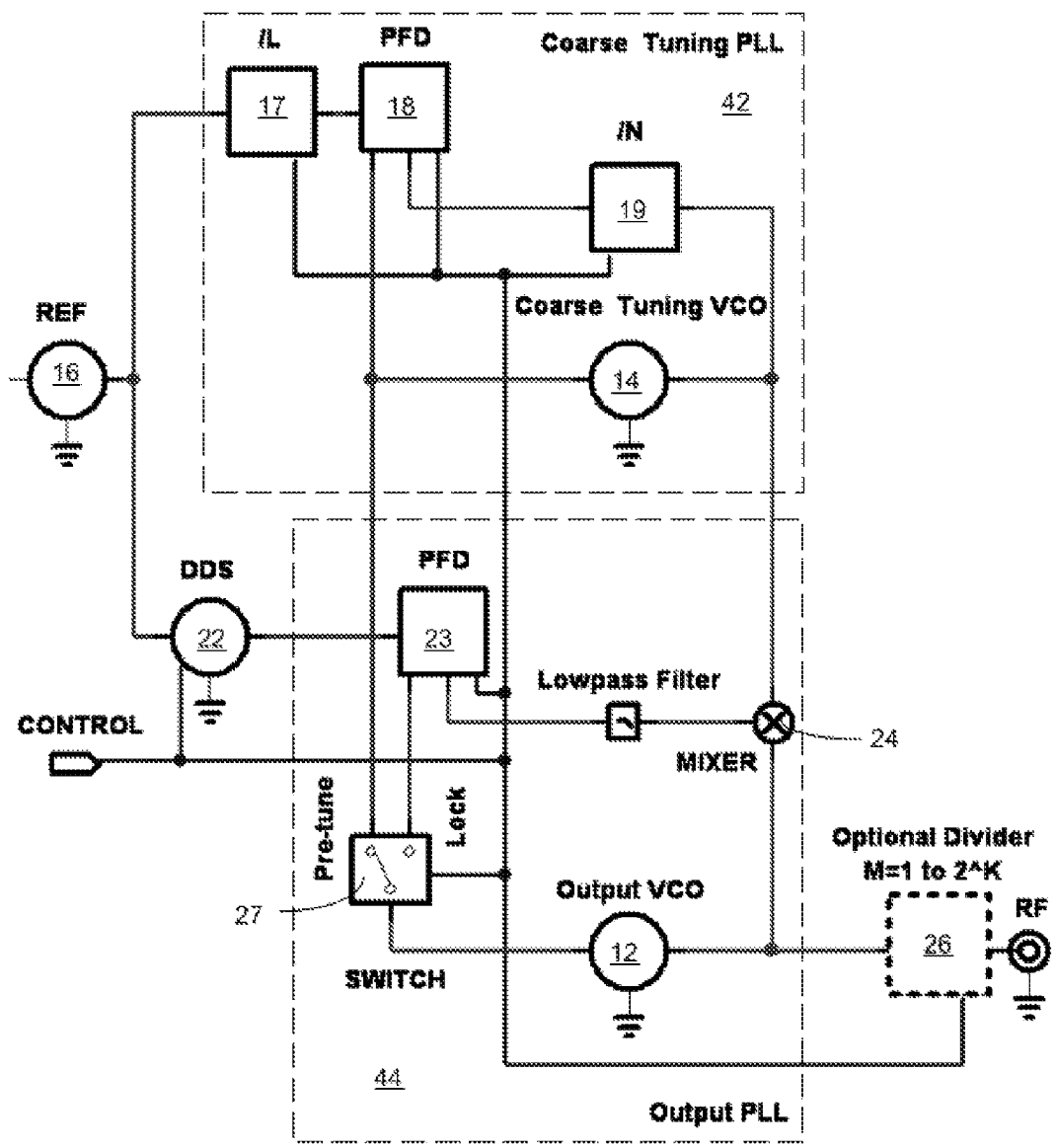
FIG. 4 is a block diagram of a microwave synthesizer according to an embodiment of the present invention.

Referring now to FIG. 4, a block diagram of a microwave synthesizer 40 is shown according to an embodiment of the present invention. The availability of integrated broadband microwave VCOs and microwave monolithic integrated circuits (MMIC) may make it feasible to use phase locking technique to realize a microwave synthesizer with octave-band microwave tuning range, with low in-loop phase noise and small tuning frequency steps. The octave frequency ranges then may be divided in binary increments (1, 2, 4, 8, . . . , 2k), that may allow contiguous frequency coverage toward lower frequencies. The frequency range division may also improve the in-loop output phase noise. The phase noise may be limited only by the noise floor of the divider.

The microwave synthesizer 40 may include a coarse-tuning loop 42 and an output loop 44. The coarse-tuning loop 42 and the output loop 44 may be coupled via a frequency mixer 24.

The coarse-tuning loop 42 may include a coarse-tuning VCO 14 for large frequency steps. The coarse-tuning VCO 14 may be phase locked to a reference frequency source 16 by a coarse-tuning PFD 18. The coarse-tuning PFD 18 may be coupled to the reference frequency source 16 via a first frequency divider 17. A first terminal of the coarse-tuning PFD 18 may be coupled to the first terminal of the coarse-tuning VCO 14. The second terminal of the coarse-tuning PFD 18 may be coupled to a second terminal of the coarse-tuning VCO 14 via a second frequency divider 19.

The output loop 44 may include an output VCO 12. A first terminal of the output VCO 12 may be coupled to a first terminal of an output PFD 23. A DDS 22 coupled to the frequency source 16 may provide a programmable frequency reference to the output PFD 23. The output VCO 12 may be phase locked to the coarse-tuning VCO 14 via the frequency mixer 24.

The VCO 12 and VCO 14 may be chosen to have the or approximately the same tuning ranges about 6 GHz to 12.08 GHz. The reference frequency source 16 may be a 1 GHz crystal oscillator. The frequency divider with an L equal to 5 may be producing 200 MHz for a reference frequency of the coarse-tuning PFD 18; i.e. the tuning step size. The DDS 22 output may range from about 40 MHz to 240 MHz. When added to each coarse step, 6.04 to 12.08 GHz one full octave frequency range may be provided. A programmable output divider 26 may be employed at the output of the microwave synthesizer 40 to extend the frequency range downward as needed.

In use, the coarse tune VCO 14 may need to lock first, with the switch 27 in pre-tune position, under digital control. Then the switch may be switched to lock position to phase lock VCO 12.

With loop bandwidths higher than 500 KHz, it might be feasible to change the microwave synthesizer's 40 frequencies in less than 100 microseconds. With available integrated components, at 10 GHz, single sided phase noise power density of −120 dBc/Hz may be achievable in the coarse loop at 10 KHz frequency offset from a carrier. At the same offset, the DDS residual single sided power density (SSPD) may be about −145 dBc/Hz at 240 MHz output, while even less at lower DDS frequencies.

In some alternative embodiment, instead of dividing the VCO's frequencies down to that of the reference frequency, the reference frequency may be multiplied to the VCO frequency with a comb generator or other suitable component. The DDS 22, may be replaced with a low frequency VCO-PLL. The frequency range may also be made narrower or wider than an octave. Any tunable source(s) may be substituted for the VCO(s); however, the loops might be designed for the given properties of the substitutes. The disclosed microwave synthesizer 40 may also work at frequencies other than the ones described above. Phase locking the two VCO's to each other first at a convenient frequency, and then locking VCO 14 to the fixed reference may also work. It may be possible to add and subtract the DDS frequency to that of the coarse tuning VCO, thereby allowing coarse steps that may be even larger (e.g. twice as large), further reducing phase noise.

While embodiments and applications of this invention have been shown and described, it will now be apparent to those skilled in the art having the benefit of this disclosure that many more modifications than mentioned above are possible without departing from the inventive concepts disclosed herein. Therefore, the appended claims are intended to encompass within their scope all such modifications as are within the true spirit and scope of this invention.

What is claimed is:

1. A microwave synthesizer, comprising:
   a coarse-tuning loop, the coarse-tuning loop adopted to generate a first signal with coarsely adjustable frequency, wherein
      the coarse tuning loop having a first voltage controlled oscillator (VCO);
   an output loop adopted to generate a second signal with finely adjustable frequency, wherein
      the output loop including a second VCO, the second VCO having a first and a second terminal,
      a phase-frequency detector (PFD), the PFD having a first and a second terminal, the second terminal of the second VCO is coupled to second terminal of the PFD via a frequency mixer, the first terminal of the PFD is coupled to the first terminal of the second VCO, the frequency mixer configured to couple the coarse-tuning loop and the output loop, the frequency mixer adopted to subtract the first and second signals;
   a direct digital synthesizer, the direct digital synthesizer provides tunable reference frequency to the second VCO; and
   a reference frequency source coupled to the coarse-tuning loop and the output loop to provide reference signal for the microwave synthesizer.

* * * * *